Nov. 16, 1965 C. E. RUOFF 3,218,472

TRANSISTOR SWITCH WITH NOISE REJECTION PROVIDED BY VARIABLE CAPACITANCE FEEDBACK DIODE

Filed May 21, 1962 2 Sheets-Sheet 1

INVENTOR

CARL E. RUOFF

BY John C Black

ATTORNEY 3,218,472
Patented Nov. 16, 1965

3,218,472

TRANSISTOR SWITCH WITH NOISE REJECTION PROVIDED BY VARIABLE CAPACITANCE FEEDBACK DIODE

Carl E. Ruoff, Endwell, N.Y., assignor to International Business Machines Corporation, New York, N.Y., a corporation of New York Filed May 21, 1962, Ser. No. 196,377
5 Claims. (Cl. 307—88.5)

Figure 1:
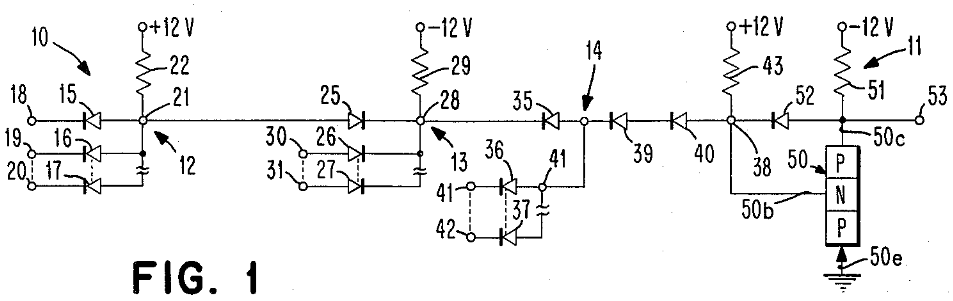

This invention relates generally to a transistor switch and more particularly to a transistor switch which has very low susceptibility to transient noise in both its conducting an nonconducting states.

High frequency noise creates a problem in data processing logic circuits and a particularly difficult problem in multilevel diode logic circuits in which a transistor switch terminating the diode logic network produces an output data signal when the desired logic function is satisfied at the network inputs. There are many conditions in which the diodes respond to input data other than the desired logic function to produce a significant noise level which in known circuits causes the transistor switch to produce an output signal sufficient in intensity to be recognized as a data signal. It is of primary importance to eliminate this error signal.

Various solutions have been proposed for minimizing or eliminating this noise problem; however, since the primary objective in the utilization of diode logic is achieving as low a cost as possible, these proposed solutions are self-defeating because they unduly increase the cost of the diode logic circuit.

Accordingly, it is a primary object of the present invention to provide a simplified, economic transistor switch which does not respond to significant noise levels at its input.

The logic circuits of a substantial part of commercially available data processing equipment can be operated at low speeds, for example, 100 kilocycles. It has been found that, when a multilevel diode logic circuit operated at these speeds terminates in a grounded emitter transistor switch with a selenium diode (maintained in its high impedance state) directly connected between the base and collector, optimum noise rejection by the switch is achieved. At these operating speeds, the noise appears as high frequency spikes of substantial amplitude; and the selenium diode provides sufficient feedback from collector to base to prevent a switching operation by the transistor, while the data signals are reproduced in the switch output in substantially amplified form.

In addition, the diode provides greater feedback to the base of the transistor while the switch is conducting, which transistor condition requires greater noise rejection than the cutoff condition.

At cutoff, unduly high collector to base feedback to minimize response to noise will produce an excessive turn on time delay in the switch in response to a data signal which has a steep leading edge for fast turn on and thus impair usefulness of the switch. In accordance with the present invention, the capacitance of the diode is inversely proportional to the amplitude of the reverse biasing voltage applied to the diode. The reverse bias is greatest when the switch is cut off and lowest when the switch is turned on, that is, in or near saturation. Hence, the diode capacitance is minimum when the switch is turned off and maximum when the switch is turned on, whereby noise rejection is significantly greater when the switch is turned on than when turned off yet adequate noise rejection is present when the switch is turned off.

A balance is achieved whereby a noise spike of the same polarity as the data signal and at times of greater amplitude (but shorter duration) than the data signal, will not turn the switch on, yet the reasonably rapid turn on of the switch by the data pulse at the desired operating speed is not impaired. At the said low operating speeds, the selenium diode provides the required rapid turn on of the switch when a desired logic function is satisfied at the logic inputs while assuring the necessary noise rejection. In addition, the diode does not unduly delay the turn off time of the switch.

At first glance, it would appear that a suitable capacitor connected directly between the collector and base would provide the same results; however, it has been found that, when the value of the capacitance is made sufficiently high to insure reliable noise rejection, the feedback during turn on of the switch is so great that the logic circuit must be operated at significantly lower speeds. Hence, the capacitor for all practical purposes cannot be utilized at the desired speeds.

It has further been found that a silicon diode similarly connected to the transistor terminals provides the same noise rejection at higher operating speeds for example as high as 5 megacycles. Other diodes having appropriate capacitance characteristics will provide similar results.

Accordingly, it is a primary object of the present invention to provide an improved transistor switch operated at low speeds which is adapted to reject noise without impairing switch operation in response to data signals.

A more specific object is the provision, in the output of a diode logic cirucit operated at low speeds, of an improved transistor switch which is adapted to reject noise appearing at its input.

The foregoing and other objects, features and advantages of the invention will be apparent from the following more particular description of a preferred embodiment of the invention, as illustrated in the accompanying drawings.

Figure 1A:
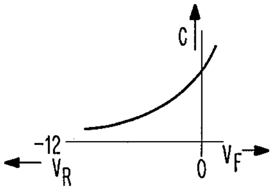

In the drawings:

FIG. 1 is a schematic diagram of a typical diode logic circuit embodying the teachings of the present invention;

FIG. 1*a* is a graph illustrating the capacitance-bias characteristics of a typical selenium diode; and FIGS. 2–8 are schematic diagrams of portions of the logic circuit of FIG. 1 and graphs illustrating various waveforms produced by said portions with and without the noise rejecting diode.

The preferred embodiment of FIG. 1 shows by way of example a diode logic circuit 10 terminating in a transistor switch 11. The circuit 10 includes three stages or levels of logic 12, 13 and 14.

Stage 12 may include as many as ten diodes, three diodes 15, 16 and 17 being shown with their cathodes connected respectively to input terminals 18, 19 and 20. The anodes of the diodes are connected in common to the junction 21, and a source of positive potential (not shown) is connected to the junction by way of a resistor 22.

Stage 13 may include as many as ten diodes, three diodes 25, 26 and 27 being shown with their cathodes connected in common to junction 28. A source of negative potential (not shown) is connected to the junction 28 by way of a resistor 29. The anode of diode 25 is connected to the junction 21, and the anodes of diodes 26 and 27 are connected to input terminals 30 and 31.

Stages 14 may include as many as ten diodes such as diodes 35, 36 and 37, the anodes of which are connected in common to junction 38 by way of series connected diodes 39 and 40. The cathode of diode 35 is connected to the junction 28, and the cathodes of diodes 36 and 37 are connected to input terminals 41 and 42. A source of positive potential is connected to junction 38 by way of a resistor 43.

The switch 11 comprises a transistor 50 having base, emitter and collector terminals, 50*b*, 50*e* and 50*c*. The base terminal is connected to the junction 38, the emitter terminal to ground potential and the collector terminal to a source of negative potential (not shown) by way of a load resistor 51. A selenium diode 52 has its anode and cathode connected respectively to the collector and base terminals respectively, and output terminal 53 is connected to the collector terminal.

The operation of the circuit is such that a negative potential appearing at the junction 38 will turn the transistor on while a slightly positive potential applied by way of the bias resistor 43 will turn the transistor off. Positive potential will appear at junction 38 to turn the transistor off unless a negative input potential is applied to one of the diodes 35, 36 or 37. A negative input potential is applied to the diode 35 only if the inputs to diodes 25, 26 and 27 are all negative. The input to diode 25 is negative if any one of the inputs to the diodes 15, 16 or 17 is negative. Thus, diodes 15–17 and 35–37 provide negative OR functions while diodes 25–27 provide a negative AND function.

The logical function which turns on the transistor is a negative input at either terminal 41 or 42, or coincident negative inputs to terminals 30 and 31 and one of the terminals 18, 19 or 20. In Boolean form, this may be expressed as 41+42+30—31(18+19+20).

The voltage levels of the data signals applied to the various input terminals will nominally swing from zero or ground potential to —12 volts. However, because of voltage supply and component tolerances, the data signals may vary from 0 to —.2 volts and —3.86 to —12.48 volts.

Assuming a negative potential is applied to the junction 38 by reason of the satisfaction of one of the logical functions described above, the transistor turns on and junction 38 is clamped by way of the base emitter junction to approximately —.3 volt. The input signal amplitude is relatively high so that the transistor 50 will be driven into saturation; and the collector potential will rise approximately to ground potential. Although the base collector junction is slightly forward biased in the saturated condition of the transistor whereby the selenium diode 52 is slightly forward biased, nevertheless, the forward bias potential is low and the diode 52 is maintained in the high resistance region of its characteristic. When the negative potential is removed from the junction 38, the transistor turns off and the collector potential falls to —12 volts.

Thus it can be seen that when the transistor is turned off, the diode 52 is reverse biased by the negative 12 volt collector power supply and the slightly positive potential applied to the terminal 38 by way of the logic inputs, the diodes 39 and 40, and resistor 43. When the transistor is turned on, it can be seen that the forward bias potential across the diode 52 is close to zero volts.

With particular reference to FIG. 1*a* it can be seen that the capacity of the diode 52 is relatively low during cutoff and that the capacity of the diode 52 is several times greater during saturation. Typical values of capacitance for the selenium diode are in the order of 180 micro-microfarads at 12 volt reverse bias and approximately 400 micro-microfarads with approximately zero potential difference across the terminals.

It will be appreciated that for optimum noise rejection while maintaining as high an operating speed as possible, a selenium diode 52 will be used which has the lowest capacitance characteristic that guarantees rejection of noise. The noise level is determined to a great extent by the values of the capacitances of the various logic diodes such as 15–17, 25–27, 35–37 and diodes 39 and 40. The logic diodes are preferably selenium diodes because of their unusually low cost, and the maximum noise level produced by these diodes with given tolerances and under various operating conditions is dependent upon the value of the capacitance of the diodes and can be determined. With higher capacitance values in the logic diodes, the noise levels will be higher; and therefore the capacity of the diode 52 must be higher to assure rejection of noise. With the maximum noise level determined, the specifications for the diode 52 may be fixed with reasonable tolerances.

For higher speed operation where silicon diodes are used, the diode capacitance values with reasonable tolerances may be similarly fixed for optimum circuit operation.

Figure 2:
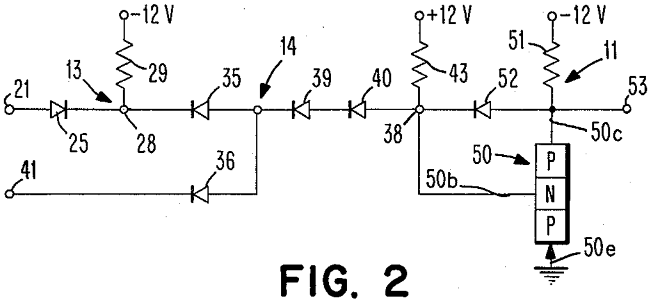
Figure 3:
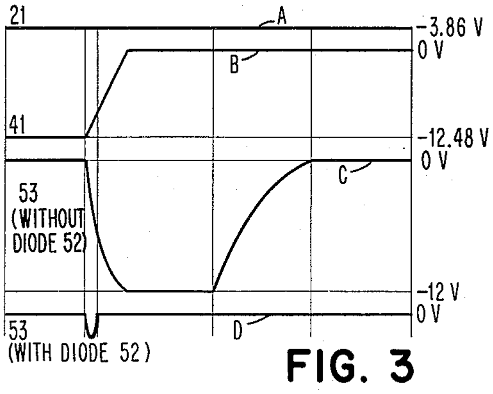
Figure 4:
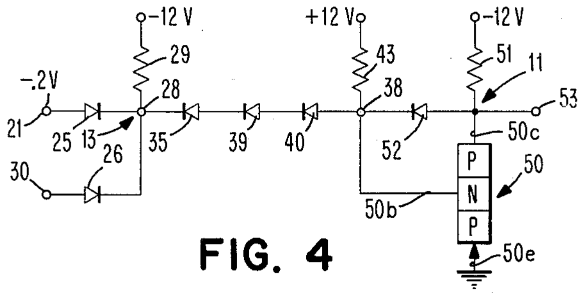
Figure 5:
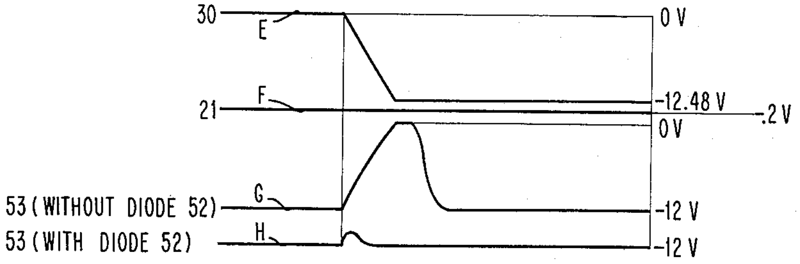
Figure 6:
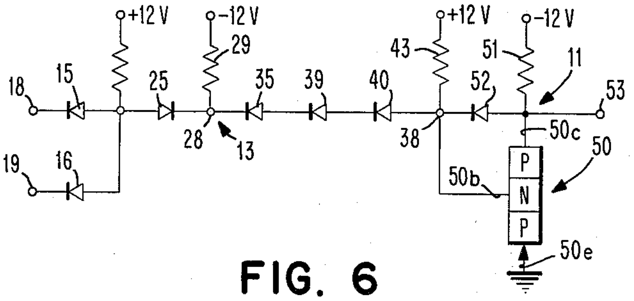

FIGS. 2–8, inclusive, show various circuit conditions which without the diode 52 produce noise that is recognized as data pulses. It will be noted that FIGS. 2, 4 and 6 show portions of the circuit of FIG. 1 and corresponding components have been given the same reference numerals. In FIG. 3, waveform A shows a typical voltage level which occurs at the junction 21 when the negative AND function is satisfied at the inputs to the diodes 25–27 to turn the transistor on; waveform B is a portion of a typical data signal applied to the input terminal 41; waveform C is a typical error signal which appears at the output 53 in response to the waveforms A and B when the diode 52 is not connected in the circuit as shown; and waveform D is a typical waveform of the output at 53 in response to waveforms A and B when the diode 52 is provided.

The positive-going swing of waveform B applied to the input terminal 41 results in a high positive spike applied to the terminal 38 by way of the capacitances of the diodes 36, 39 and 40. This positive spike will turn the transistor off for a short time duration as illustrated by waveform C even though the desired logic function is still satisfied by waveform A. Although their turn off condition is of substantially shorter time duration than the width of a data pulse, nevertheless it is of sufficiently substantial amplitude and time duration to be recognized as a data signal (logic 0) by the circuits forming the load of the transistor 50. Thus even though the negative 3.86 volt potential of waveform A applied to the terminal 21 for proper operation of the circuit should maintain the transistor conducting, the positive-going leading edge of the waveform B will momentarily turn off the transistor unless the diode 52 is utilized. Assuming turn on of the transistor to be a logic 1, the load circuits of the transistor 50 will recognize an output logic zero rather than a logic 1, if the diode 52 is not utilized. It is apparent from waveform D that the slight negative pulse occurring at the leading edge of the positive-going swing of waveform B is so small and of such short time duration that it will not be recognized as a logic zero.

FIGS. 4 and 5 illustrate the effect of a negative-going pulse applied to terminal 30 when the transistor is off and while a negative .2 volt potential is applied to terminal 21. The leading edge of the negative-going swing of waveform E applied to the terminal 30 will produce a positive-going output pulse (logic 1) at terminal 53 (waveform G) when the diode 52 is not utilized even though the negative AND function of diodes 25–27 is not satisfied. With respect to waveform H, it will be seen that the output 53 will see only a very small, short time duration positive-going pulse when the diode 52 is utilized.

The error (logic 1) pulse in the waveform G (FIG. 5) is substantially shorter in time duration than the corresponding error pulse (logic 0) in waveform C of FIG. 3 which latter pulse occurs while the transistor is normally on. As a result, the feedback requirements for eliminating the error pulse of waveform G are substantially less than the feedback requirements to eliminate the error pulse of waveform C. As best seen in FIG. 1*a*, the capacity of the diode 52 is substantially greater when the transistor is turned on than when it is turned off and thus optimum feedback conditions are obtained in the turn off and turn on conditions.

Figure 7:
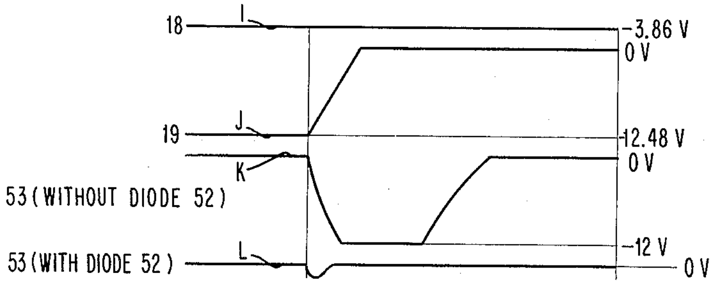

With respect to FIGS. 6 and 7, it will be seen that an error pulse (logic 0) will appear at the output 53 (waveform K) without the diode 52 being provided in the event that a positive-going pulse (waveform J) is applied to the input terminal 19 while the transistor is on and while negative 3.86 volt potential (waveform I) is applied to the input terminal 18. It is further seen that, when the diode 52 is provided, only a very small and insignificant negative going noise pulse (waveform L) is produced at the output terminal 53.

Figure 8:
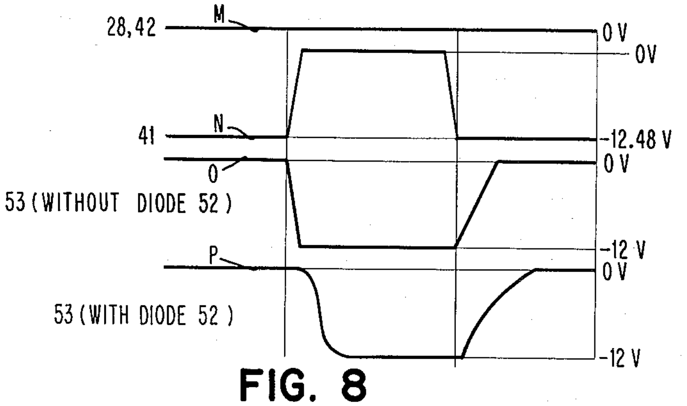

The waveforms M, N, O and P of FIG. 8 illustrate the turn on and turn off delays at the output terminal 53 when the diode 52 is used and when it is omitted. The positive-going slope of the waveform N produces turn off of the transistor and its negative-going slope produces turn on. When the diode 52 is not used as illustrated in waveform O, there are short turn on, turn off delays. As seen in waveform P these turn on, turn off delays are somewhat greater. The value of the capacity of the diode 52 at turn on and turn off will determine the amount of time delay in the output pulse. With proper selection of the diode 52 as described above, the turn on and turn off delays present no problems at operating speeds in the order of 100 kilocycles or less when a selenium diode is used and at operating speeds in the lower megacycle range or less when a silicon diode is used. In the event that a standard capacitor were utilized instead of the diode 52 and were of sufficient value to assure rejection of noise for the conditions stated above with respect to FIGS. 2–7, the turn on delays will frequently be so great as to prevent operation at the desired speeds. Therefore, the capacitor is not commercially practicable in the logic circuits described where as high an operating speed as is possible must be maintained.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. In an electrical circuit of the type in which a logic circuit including an output terminal, a plurality of input terminals and a plurality of diodes produces a signal at its output terminal upon application of signals to the inputs in accordance with a predetermined logical function, the combination with the logic circuit of a switch comprising a transistor having base, emitter and collector terminals, the base terminal being connected to the output terminal of the logic circuit, means including a source of potential for operating the transistor in a common emitter configuration and for operating the transistor in saturation in response to signals produced at the output terminal of the logic circuit and a selenium diode connected directly to the base terminal and directly to the collector terminal in the reverse bias direction to maintain the diode in the high resistance region of its characteristic under all operating conditions for providing a variable capacitance feedback from the collector terminal to the base terminal.

2. In an electrical circuit of the type in which a logic circuit including an output terminal, a plurality of input terminals and a plurality of diodes produces a signal at its output terminal upon application of signals to the inputs in accordance with a predetermined logical function, the combination with the logic circuit of a switch comprising a transistor having base, emitter and collector terminals, the base terminal being connected to the output terminal of the logic circuit, means including a source of potential for operating the transistor in a common emitter configuration and for operating the transistor in saturation in response to signals produced at the output terminal of the logic circuit, and a silicon diode connected directly between the base and collector terminals in the reverse bias direction to maintain the diode in the high resistance region of its characteristic under all operating conditions for providing a variable capacitance feedback from the collector terminal to the base terminal.

3. A switch comprising a transistor having base, emitter and collector terminals, means including a source of potential for operating the transistor in a common emitter configuration, a source of input signals for operating the transistor alternatively at cutoff and in saturation, and an impedance having substantially the variable capacitance-bias voltage characteristics of a reverse biased selenium diode connected directly between the base and collector terminals and presenting a capacitive coupling between the base and collector terminals, the value of which increases as the transistor is switched from cutoff to saturation, to provide noise rejecting feedback from collector to base at one level when the transistor is near cutoff and at a substantially higher level when the transistor is conducting heavily.

4. A switch comprising a transistor having base, emitter and collector terminals, means including a source of potential for operating the transistor in a common emitter configuration, a source of input signals for operating the transistor alternatively at cutoff and in saturation, and an impedance having substantially the variable capacitance-bias voltage characteristics of a reverse biased silicon diode connected directly between the base and collector terminals and presenting a capacitive coupling between the base and collector terminals, the value of which increases as the transistor is switched from cutoff to saturation, to provide noise rejecting feedback from collector to base at one level when the transistor is near cutoff and at a substantially higher level when the transistor is conducting heavily.

5. A switch adapted to produce output signals in response to input data signals of a predetermined high frequency and to reject input noise signals of substantially higher frequencies, said switch comprising a transistor having base, emitter and collector terminals, means including a source of potential for operating the transistor in a common emitter configuration, a source of input signals for operating the transistor alternatively at cutoff and in a state of heavy conduction, and a semiconductor element, which enters its low resistance region at a bias value substantially equivalent to that of selenium or silicon, having predetermined variable capacitance-bias voltage characteristics and connected directly between the base and collector terminals in its reverse bias direction to maintain the semiconductor element in the high resistance region of its characteristic under all operating conditions for providing a variable capacitance feedback from the collector terminal to the base terminal to provide noise rejecting feedback from collector to base at one level when the transistor is near cut-off and at a substantially higher level when the transistor is conducting heavily.

References Cited by the Examiner

UNITED STATES PATENTS

| | | | |
|---|---|---|---|
| 2,990,478 | 6/1961 | Scarbrough | 307—88.5 |
| 3,010,031 | 11/1961 | Baker | 307—88.5 |
| 3,053,997 | 9/1962 | Cobbold | 307—88.5 |
| 3,083,303 | 3/1963 | Knowles et al. | 307—88.5 |
| 3,098,939 | 7/1963 | Clapper | 307—88.5 |
| 3,143,664 | 8/1964 | Lourie et al. | 307—88.5 |

FOREIGN PATENTS

| | | |
|---|---|---|
| 215,148 | 5/1958 | Australia. |

OTHER REFERENCES

Pub I. "Junction Transistor Electronics" by Hurley, 1958, pages 385–386 and Figure 20.8 are pertinent.

ARTHUR GAUSS, *Primary Examiner.*